United States Patent [19]
Conroy-Wass

[11] Patent Number: 5,324,206
[45] Date of Patent: Jun. 28, 1994

[54] MULTIMODULE TERMINATING PLANE ASSEMBLY

[75] Inventor: Theodore R. Conroy-Wass, Tustin, Calif.

[73] Assignee: Hughes Aircraft Company, Los Angeles, Calif.

[21] Appl. No.: 923,189

[22] Filed: Jul. 31, 1992

[51] Int. Cl.⁵ .............................................. H05K 1/00
[52] U.S. Cl. ...................................... 439/77; 439/709; 439/638; 439/65
[58] Field of Search ...................... 439/62–65, 439/633, 709, 638, 639, 640, 654, 655, 61, 77, 67

[56] References Cited

U.S. PATENT DOCUMENTS

| | | | |
|---|---|---|---|
| 3,475,657 | 10/1969 | Knowles | 439/62 |
| 3,639,893 | 2/1972 | Kunkle et al. | 439/633 |
| 3,715,706 | 2/1973 | Michel et al. | 439/65 |
| 3,966,290 | 6/1976 | Little et al. | 439/633 |
| 4,530,554 | 7/1985 | Velsher et al. | 439/62 |
| 5,026,290 | 6/1991 | Dery | 439/65 |

Primary Examiner—David L. Pirlot
Attorney, Agent, or Firm—E. E. Leitereg; T. Gudmestad; W. K. Denson-Low

[57] ABSTRACT

An arrangement is provided for mounting double ended hermaphroditic signal mode modules (10) that includes an elongated carrier (68) having longitudinal walls (70, 77) and transverse walls (71, 74) that define pockets to receive the connectors (10) and position them accurately so that one set of contact arrays (59) engages contact arrays (86) of a printed circuit board (69) attached to one side of the carrier by a clamping bar (82). Grounding means (87) may be provided at the connections to the printed circuit board (69). The other contact arrays (56) of the connectors (10) face outwardly on the other side of the carrier (68) to engage identical connectors (10). The carriers (68) may be attached to a frame (92) to interconnect printed circuit boards (69) positioned at 90 degrees relative to each other on opposite sides of the frame (92). The carrier (68) may include means (73) to support another connector for supplying power to the printed circuit board (69).

9 Claims, 10 Drawing Sheets

MULTIMODULE TERMINATING PLANE ASSEMBLY

BACKGROUND OF THE INVENTION

1. Field of the Invention

This invention pertains to the interconnection of electrical components and more particularly to a carrier and midplane mounting arrangement for the interconnection of printed circuit boards.

2. Description of Related Art

The interconnection of printed circuit boards conventionally has required transitional printed circuit boards positioned between two groups of printed circuit boards to which the connections are to be made. The transitional board serves to make the electrical connections among the various printed circuit boards grouped. This is disadvantageous in requiring an extra printed circuit board and conventional connecting means. Jumper cables and pin and socket connectors typically are employed. These arrangements are complex, costly and do not permit high density of interconnections.

An arrangement making use of hermaphroditic connectors is disclosed in patent application Ser. No. 801,977, filed Dec. 3, 1991, U.S. Pat. No. 5,199,881 by Felix M. Oshita, Ronald L. Campbell and Theodore R. Conroy-Wass for HERMAPHRODITIC INTERCONNECTION OF CIRCUIT BOARDS. This application has the same assignee as the present application and is incorporated herein by reference. In the arrangement of that application, hermaphroditic node connectors are provided along the edges of circuit boards to be interconnected and are pressed together at their forward faces where contacts are brought into engagement. In that design, however, there was not a suitable arrangement for carrying a large number of the hermaphroditic connectors or for supporting them for interengagement.

SUMMARY OF THE INVENTION

The present invention provides a hermaphroditic high density multiple module terminating interconnection plane which provides zero force actuation, retention and alignment and can accommodate signal mode modules as well as fiber optic and power connectors. Universal interconnect patterns to another module terminating plane can be achieved.

The carrier of the terminating plane provides a series of separate uniformly spaced and sized pockets or receptacles that result in a high density of node snap-in type or compression clamp-type modules. These can be used separately or in series. The carrier arrangement includes an elongated metallic member which is rigid and provided with receptacles or pockets which open toward one side and in another direction at 90 degrees relative to that side. The metal carrier provides shielding. A printed circuit board is precisely aligned with the carrier and secured to the carrier by a clamp bar. This permits printed circuit boards of different thicknesses to be accommodated. The signal mode modules or connectors are received in the pockets of the carrier where they are retained in precise registry with the contact arrays of the printed circuit board. This causes a contact array of the connector to be pressed against the contact array of the printed circuit board at each of the pockets to provide a multiplicity of electrical connections to the circuit board. At the other side of the carrier, the connector module faces outwardly to be pressed against an identical connector carrier by another carrier.

A midplane terminating arrangement is provided by a frame to which the carriers are attached. On one side of the frame one group of the carriers and their associated printed circuit boards are mounted in parallelism in one direction, while a second group on the other side of the frame are in parallelism in a direction at 90 degrees relative to the first group. All of the printed circuit boards may be interconnected in this manner in a very compact relationship.

The carrier may include an extension at one end or at both ends to receive a conventional connector for supplying power to the printed circuit boards. This connector may include provision for making both electrical and fiber optic connections.

Grounding may be achieved by grommets and engage both the clamping bar and a grounding plane of the printed circuit board. Another grounding arrangement may include conductive gaskets on the forward sides of the carrier.

DESCRIPTION OF THE PREFERRED EMBODIMENTS

Figure 1:
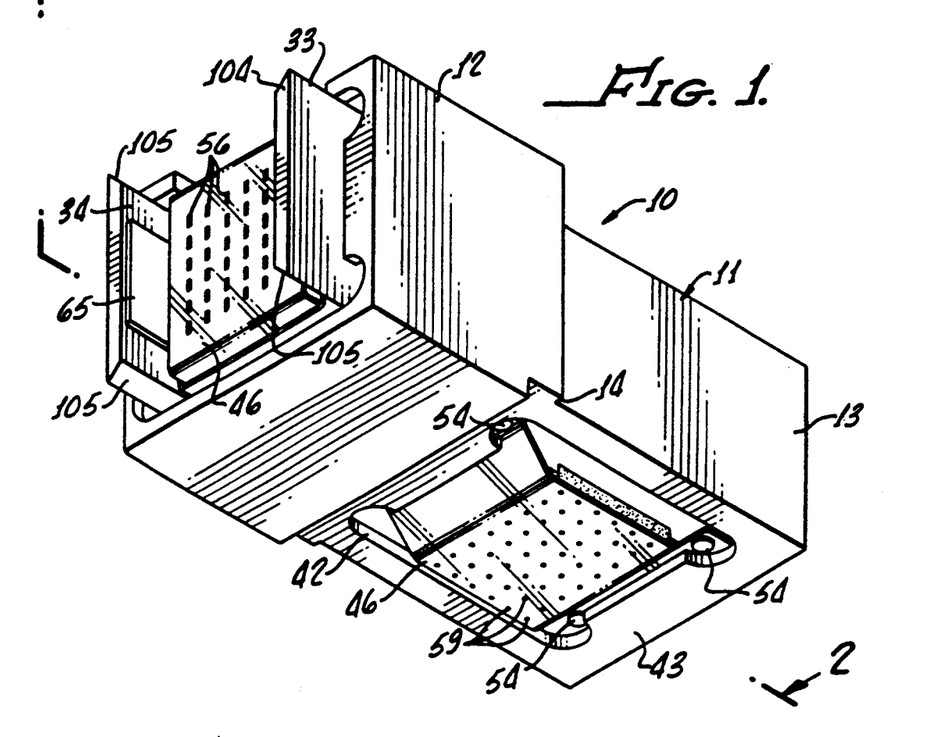
FIG. 1 is a perspective view of an electrical connector.
Figure 2:
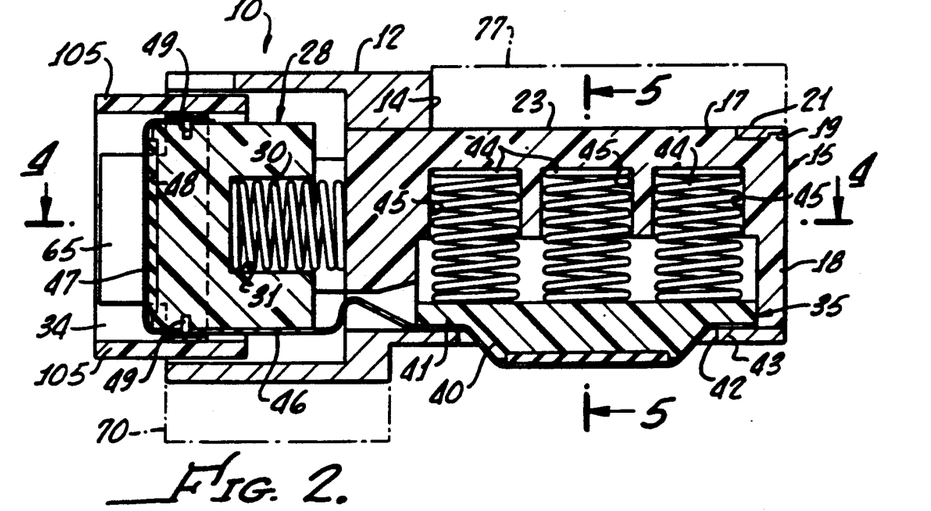
FIG. 2 is a longitudinal sectional view taken along line 2—2 of FIG. 1.
Figure 3:
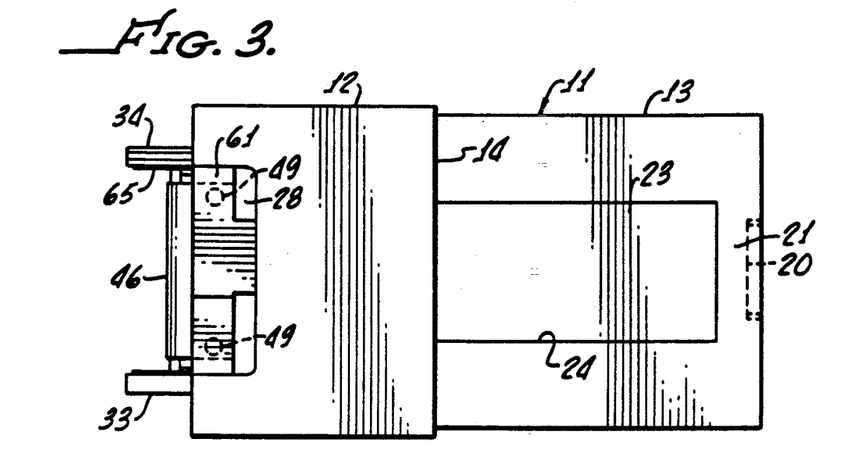
FIG. 3 is a top plan view of the connector.

The connector 10 for interconnecting printed circuit boards includes a hollow housing 11 of dielectric material which includes a forward section 12 and a rearward section 13. Both the forward and rearward sections are rectangular in cross section, but the forward section 12 is of larger lateral dimension than that of the rearward section 13. This provides an external shoulder 14 on both sides and at the top between the forward and rearward sections 12 and 13.

Within the housing 11 is a body 15 which has a forward portion 16 received in the forward part 12 of the housing 11 and a rearward portion 17 that is received within the rearward portion 13 of the housing 11. The rearward end of the body 15 terminates in a flat generally rectangular transverse disk 18 positioned at the open rearward end of the housing 11. A tab 19 projecting from the upper edge of the disk portion 18 is received in a notch 20 at the rearward end of the upper wall 21 of the rearward portion 13 of the housing 11. This prevents the member 15 from moving forwardly relative to the housing 11.

A flat ridge 23 on the upper surface of the rearward portion 17 of the body 15 is complementarily received in an elongated slot 24 through the upper wall 21 of the housing 11. The rearward edge of the ridge 23 engage the rearward edge of the slot 24 which prevents the body 15 from moving rearwardly relative to the housing 11.

Figure 4:
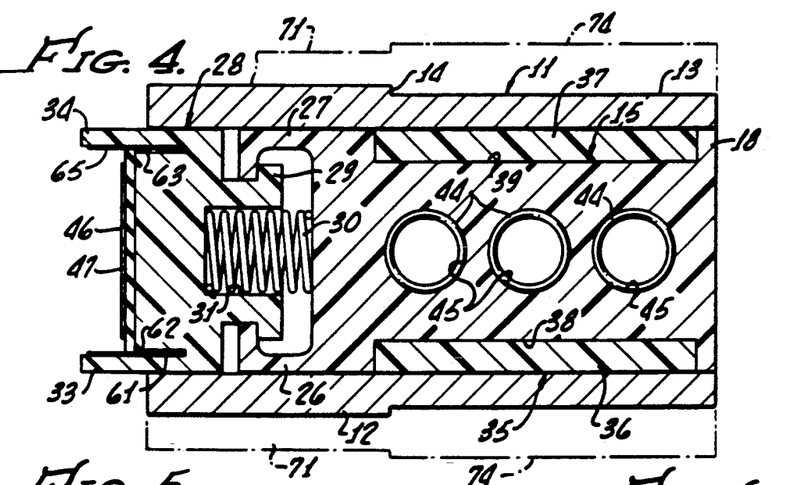
FIG. 4 is a longitudinal sectional view taken along line 4—4 of FIG. 2.
Figure 7:
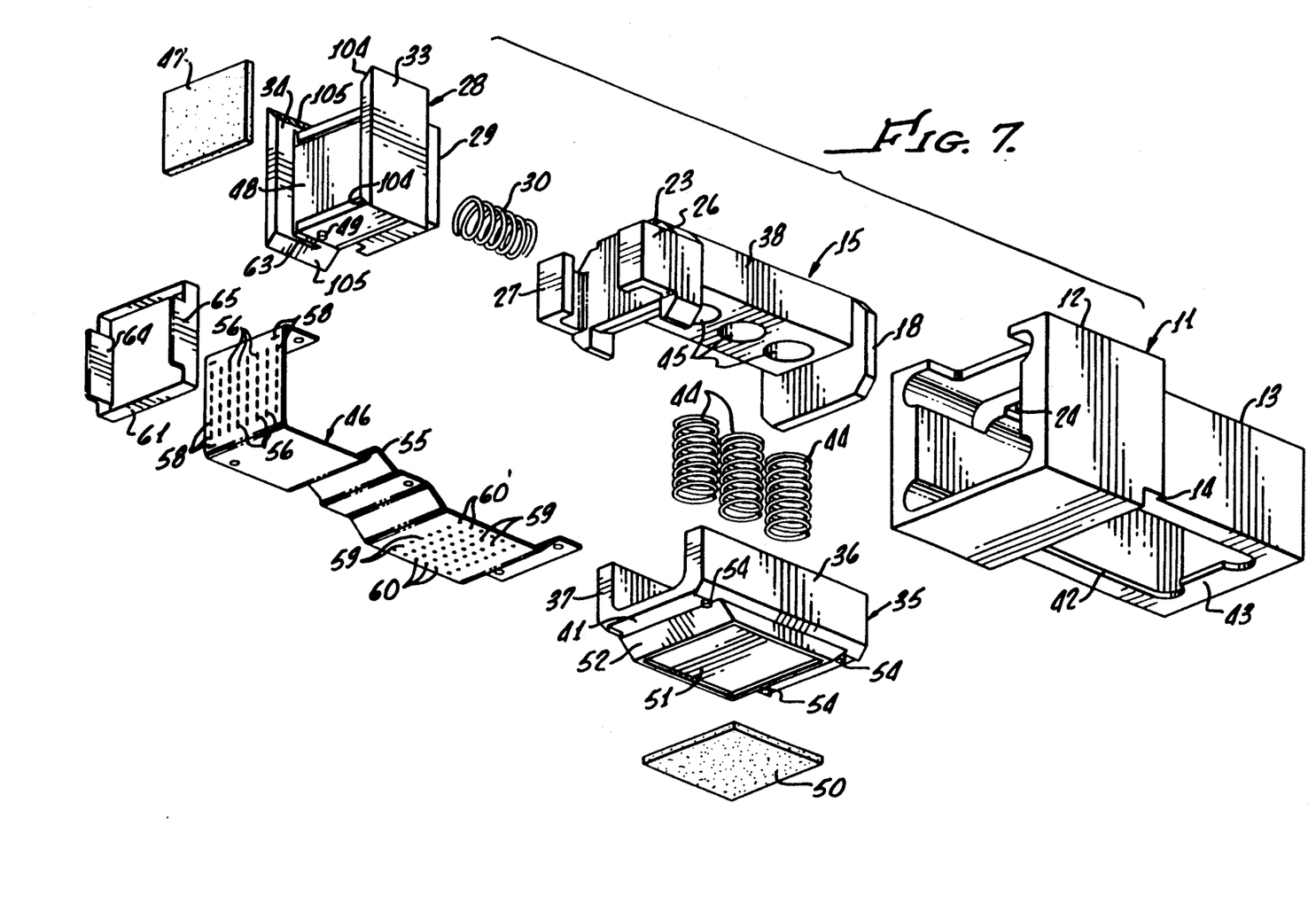
FIG. 7 is an exploded perspective view of the components of the connector as viewed generally from the front and the bottom.

At the forward end of the member 15 are two forwardly projecting L-shaped arms 26 and 27 that provide end flanges projecting toward each other (see FIGS. 4 and 7). A pressure table 28 of dielectric material is received in the open forward end 12 of the housing 11 and on either side includes a rearward flange 29 received between the arms 26 and 27 of the body 15. A compression spring 30 bears against the body 15 at one end and is received within a recess 31 in the rearward end of the pressure table 28 at its other end. This biases the pressure table 28 forwardly with respect to the housing 11 and the member 15, this movement being limited by the engagement of the flange 29 with the arms 26 and 27. The pressure table 28 has freedom for limited floating movement relative to the housing 11. Two parallel side flanges 33 and 34 extend from the forward end of the pressure table 28, projecting outwardly from the forward end of the housing 11.

Figure 5:
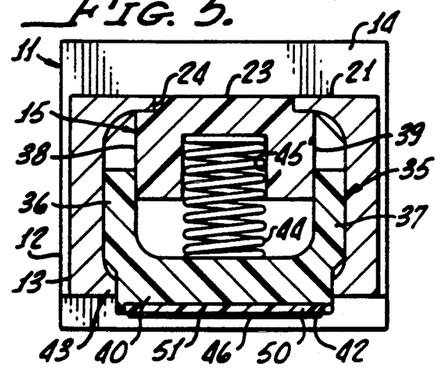
FIG. 5 is a transverse sectional view taken along line 5—5 of FIG. 2.
Figure 6:
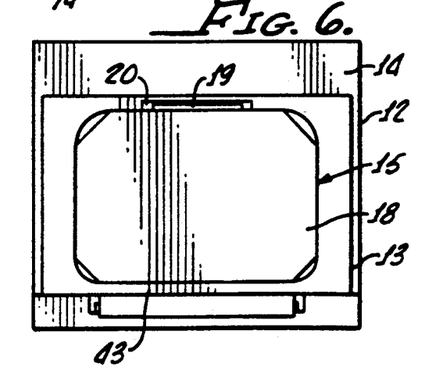
FIG. 6 is an end elevational view of the connector.
Figure 8:
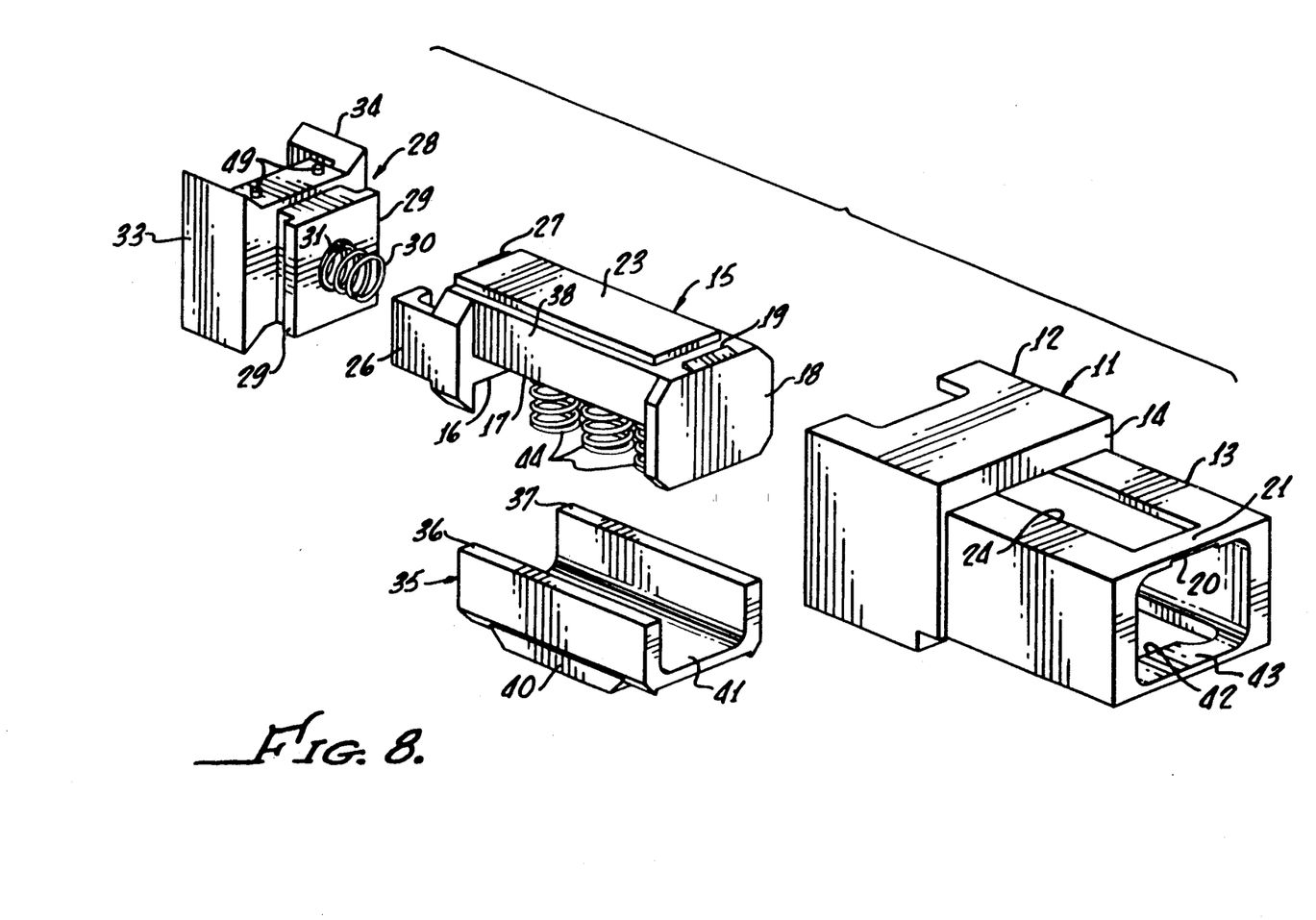
FIG. 8 is an exploded perspective view of the connector taken generally from above and to the rear.
Figure 9:
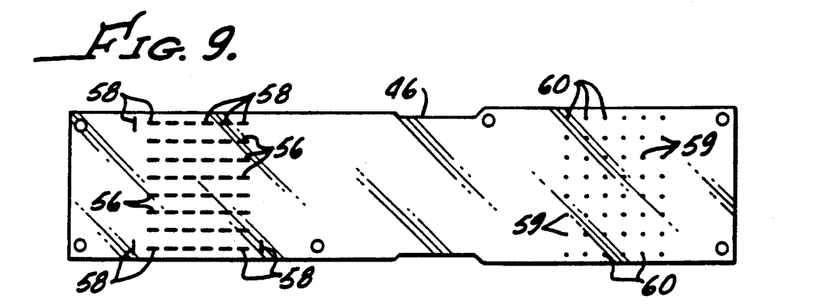
FIG. 9 is a plan view of the flexible circuit used in the connector, prior to the bending of the flexible circuit.

The rearward portion 13 of the housing 11 receives a second pressure table 35 which is generally U-shaped in cross section, as seen in FIGS. 5 and 8. The two side flanges 36 and 37 of the pressure table 35 fit around the opposite side edges 38 and 39 of the body 15 between the enlarged forward section 16 and the rearward disk 18. This holds the pressure table 35 against movement longitudinally of the body 15 and housing 11. The thickened central portion 40 of the lower wall 41 of the pressure table 35 protrudes through an opening 42 in the bottom wall 43 of the rearward portion 13 of the housing 11. Three compression springs 44 bear against the upper surface of the wall 41 of the pressure table 35 and are received within recesses 45 in the intermediate portion of the member 15. This biases the pressure table 35 downwardly, as the device is illustrated, relative to the body 15 and the housing 11. The pressure table 35 is confined to a rectilinear path of movement relative to the housing 11 by the side flanges 36 and 37 that extend around the intermediate portion of t he body 15 between the flanges 26 and 27, and the disk portion 18. This movement is perpendicular to the linear movement permitted the pressure table 28.

A flexible circuit 46, contoured as shown in FIGS. 2 and 7, extends between the pressure tables 28 and 35. The flexible circuit 46 wraps around the pressure table 28, extending over a resilient pad 47 that is positioned over the flat recessed forward surface 48 of the pressure table 28. Rivets 49 extend from the pressure table 28 through openings in the flexible circuit 46 and their outer ends are upset. This holds the flexible circuit to the pressure table 28 and maintains it in a predetermined registry with the pressure table. If desired, some or all of the pins 49 may be made of metal and make contact with a grounding conductor in the flexible circuit.

The opposite end of the flexible circuit 46 extends over the central projecting portion 40 of the pressure table 35, across a resilient elastomeric pad 50 that fits over the flat recessed bottom surface 51. The flexible circuit extends over beveled surfaces 52 and 53 of the projecting portion 40 at its forward and rearward ends and is held in proper alignment by rivets 54.

A bend 55 in the flexible circuit 46 between its two ends provides an excess length to allow the pressure tables 28 and 35 to move a limited distance relative to the housing 11. The intermediate portion of the flexible circuit 46 between the two pressure tables is received within the housing 11.

Figure 10:
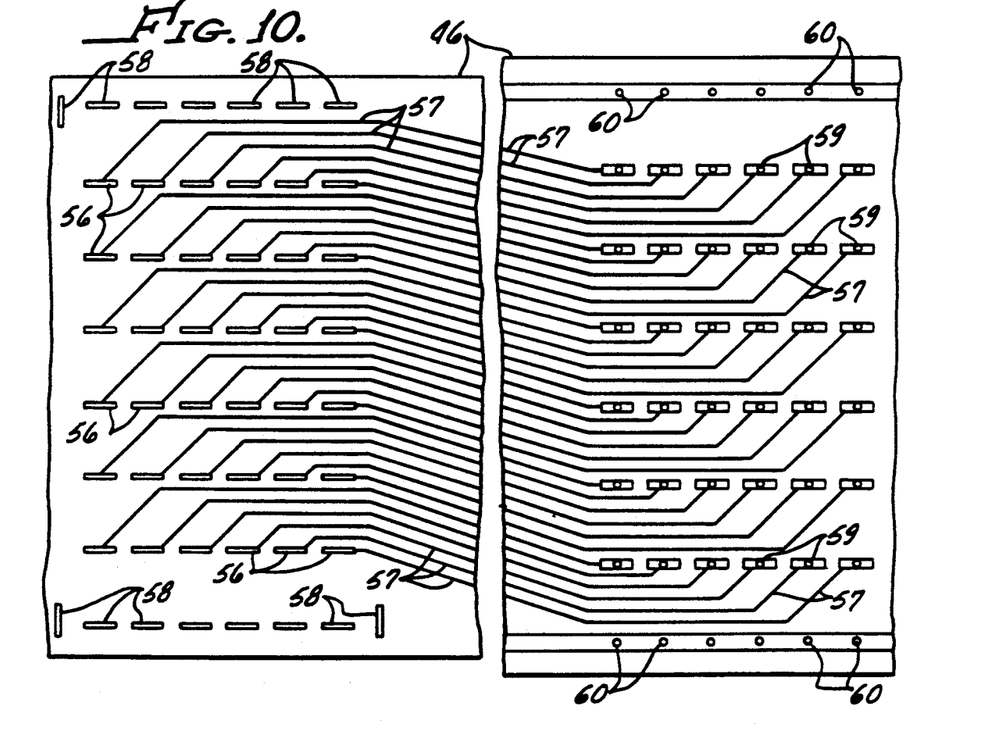
FIG. 10 is an enlarged fragmentary plan view of the flexible connector illustrating the interconnection of the contacts of the flexible circuit.
Figure 11:
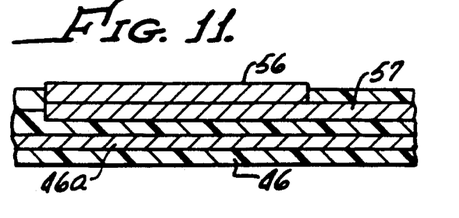
FIG. 11 is an enlarged sectional view showing the contact stripe at one end of the flexible circuit.
Figure 12:
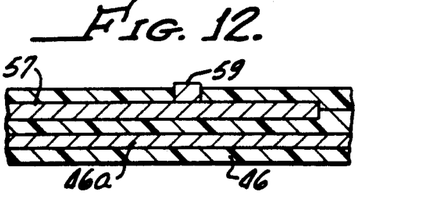
FIG. 12 is an enlarged sectional view showing the contact dot at the opposite end of the flexible circuit.

At the pressure table 28, the flexible circuit 46 provides an array of exposed parallel contact stripes 56 which project above the surface of the substrate of the circuit and are arranged in a closely spaced pattern, each connecting to a conductor 57 that is buried within the substrate (see FIGS. 10, 11 and 12). In a typical example, there are thirty-six of the contact stripes 56 at the member 28.

The opposite end of the flexible circuit 46 includes either similar contact stripes or outwardly projecting contact dots 59. The conductors 57 interconnect the contact stripes 56 and the contact dots 59. The pattern of the conductors 57 is such that the distances between all connected contacts 56 and 59 is the same (see FIG. 10).

The forward end of the connector 10 optionally may include a grounding clip 61, which has a rectangular sheet metal base portion received in slots 62 and 63 in the forward end of the pressure table 28. Opposite parallel forwardly projecting tabs 64 and 65 of the grounding clip are positioned along the inner sides of the flanges 33 and 34.

The connector 10 is hermaphroditic and can mate with an identical connector 10 at its forward end. Each of the mating connectors will be connected to a printed circuit board at its rearward end. A number of printed circuit boards can be interconnected by the arrangement shown in FIGS. 14–21.

Figures 13, 14, 15, 16:
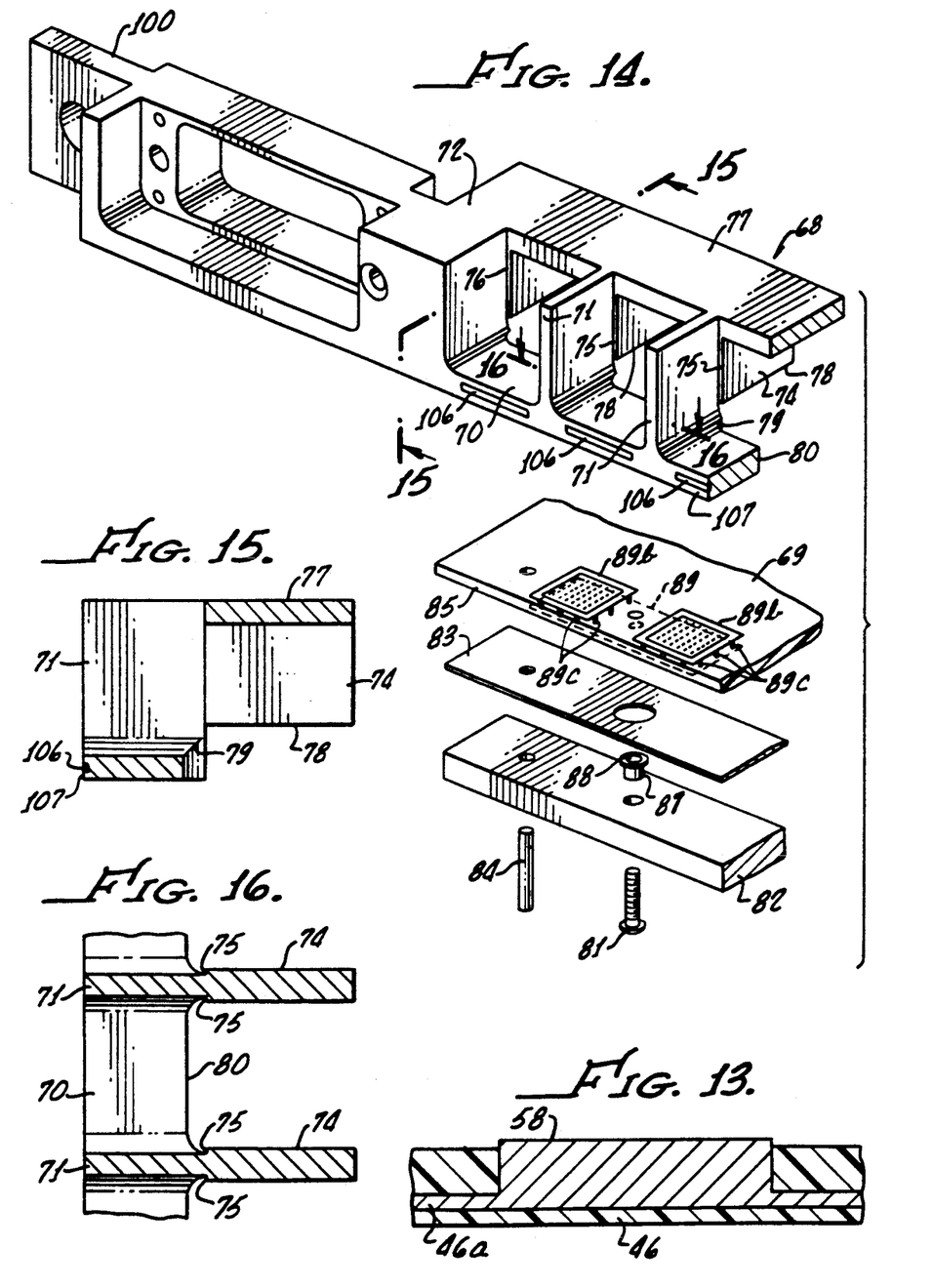
FIG. 13 is an enlarged sectional view of the flexible circuit showing the connection of the grounding contact stripes to the grounding plane.
FIG. 14 is a fragmentary exploded perspective view of the carrier for the connectors and the arrangement for attaching a circuit board to it.
FIG. 15 is a transverse sectional view taken along line 15—15 of FIG. 14.
FIG. 16 is a fragmentary sectional view taken along line 16—16 of FIG. 14.

One set of several of the connectors 10 is mounted in a carrier 68 which connects each connector 10 to contact pads of a single printed circuit board 69. The carrier 68 is an elongated member that includes a longitudinal base wall 70 and a series of equally spaced parallel forward transverse walls 71 which are perpendicular to the base wall. A thicker transverse wall 72 is at one end portion of the carrier 68. Beyond the wall 72 is a receptacle 73 which can receive an electrical connector, unlike the connector 10, which forms part of the circuit that supplies power to the printed circuit board attached to the carrier (FIG. 14). A similar wall 72 is provided at the opposite end of the carrier 68, but without a receptacle beyond it.

The transverse walls 71 extend to rearward transverse wall portions 74 of increased thickness. This results in shoulders 75 on either side of each wall 71 at the forward edge of the rearward portion 74. Similar shoulders 76 are defined at the transverse walls 72. The carrier 68, in addition, includes an upper wall 77 which extends the length of the unit parallel to the base wall 70 and over the rearward wall portions 74. The upper wall 77 is offset transversely relative to the base wall 70. Therefore, the carrier 68 defines a series of pockets or receptacles between the transverse walls 71 and between the transverse walls 73 which are open at their ends along either side of the carrier, and also open opposite from the walls 70 and 77.

The rearward transverse wall portions 74 are shorter than the forward transverse walls 71, terminating at bottom edges 78. The rearward edges 79 of the walls 71, below the bottom edges 78, extend into the rearward end of the longitudinal base wall 70. The rearward edge surface 80 of the wall 70 is recessed between adjacent edges.

Figure 17:
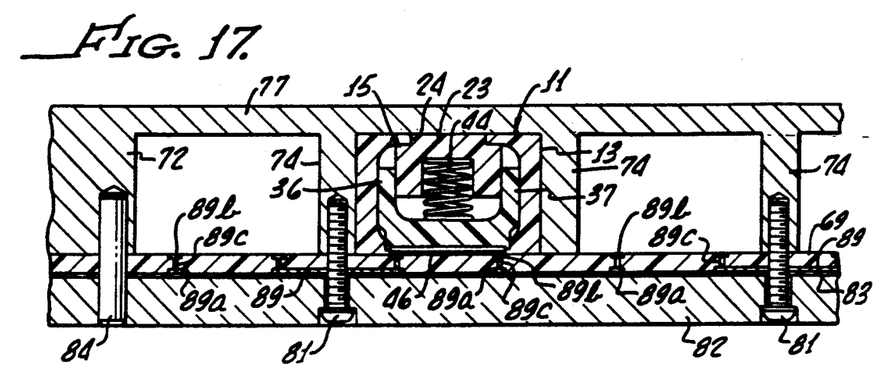
FIG. 17 is a longitudinal sectional view illustrating the attachment of the carrier to a printed circuit board.

One edge portion of the printed circuit board 69 is secured to the carrier 68 by means of screws 81 which extend through a clamping bar 82 and an insulator strip 83, as well as through the printed circuit board 69. The screws 81 are received within threaded openings in the rearward wall portions 74. Precise alignment of the components is accomplished by pins 84 which extend through the clamping bar 82, the insulator strip 83 and the printed circuit board 69 into the end walls 72 of the carrier 68. The printed circuit board 69 then engages the bottom edges 78 of the rearward transverse wall portions 74, and its edge 85 lies alongside the rearwardly facing edge 79 of the carrier 68.

Figure 18:
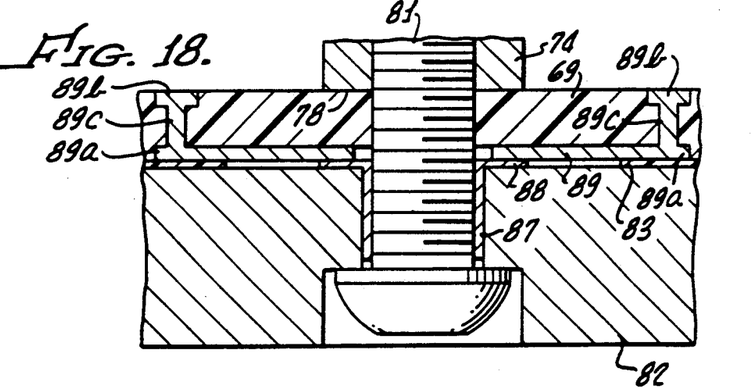
FIG. 18 is an enlarged fragmentary sectional view showing the ground connection at a printed circuit board.

The printed circuit board 68 includes signal pad arrays 86 spaced adjacent its edge 85 and positioned so that there is one such an array between adjacent wall portions 74, rearwardly of the longitudinal wall 70. A grounding field is produced by including grommets 87 around the screws 81, extending through the clamping bar 82, each with a head 88 at an opening in the insulator strip 83. A grounding plane 89 is exposed on the underside of the printed circuit board 69 and engaged by the grommet head 88. The ground conductor 89 includes openings 89a at its opposite ends so that it extends around two adjacent contact arrays 86. Each adjacent pair of contact arrays 86 is provided with a grounding field in this manner. The grounding plane 89 includes two frame portions 89b that extend around the paired contact arrays 86 on the upper side of the printed circuit board 69 and are connected to the lower portion by conductors 89c. The grounding contact dots 60 of the flexible circuit 46 engage the frame portions 89b.

A connector 10 is inserted into each of the pockets in the carrier 68 where a connection is to be made to the printed circuit board 69. The rearward portion 13 of the connector housing 11 fits generally complementarily between the two opposed rearward wall sections 74, while the forward portion 12 of the connector housing is confined between the forward transverse walls 71. The shoulder 14 between the forward housing portion 12 and the rearward housing portion 13 engages the shoulders 75 and 76 of the carrier 68 as well as the forward edge 90 of the longitudinal wall 77. This limits the travel of the connector 10 into the pocket in the carrier so that the connector 10 then has a predetermined position relative to the carrier. In that position the array of contact stripes 56 faces outwardly along the side of the carrier 68 adjacent the longitudinal base wall 70. The other array of contacts 59 of the flexible circuit 46 of the connector faces downwardly, as illustrated, adjacent the opposite side of the carrier.

Figure 21:
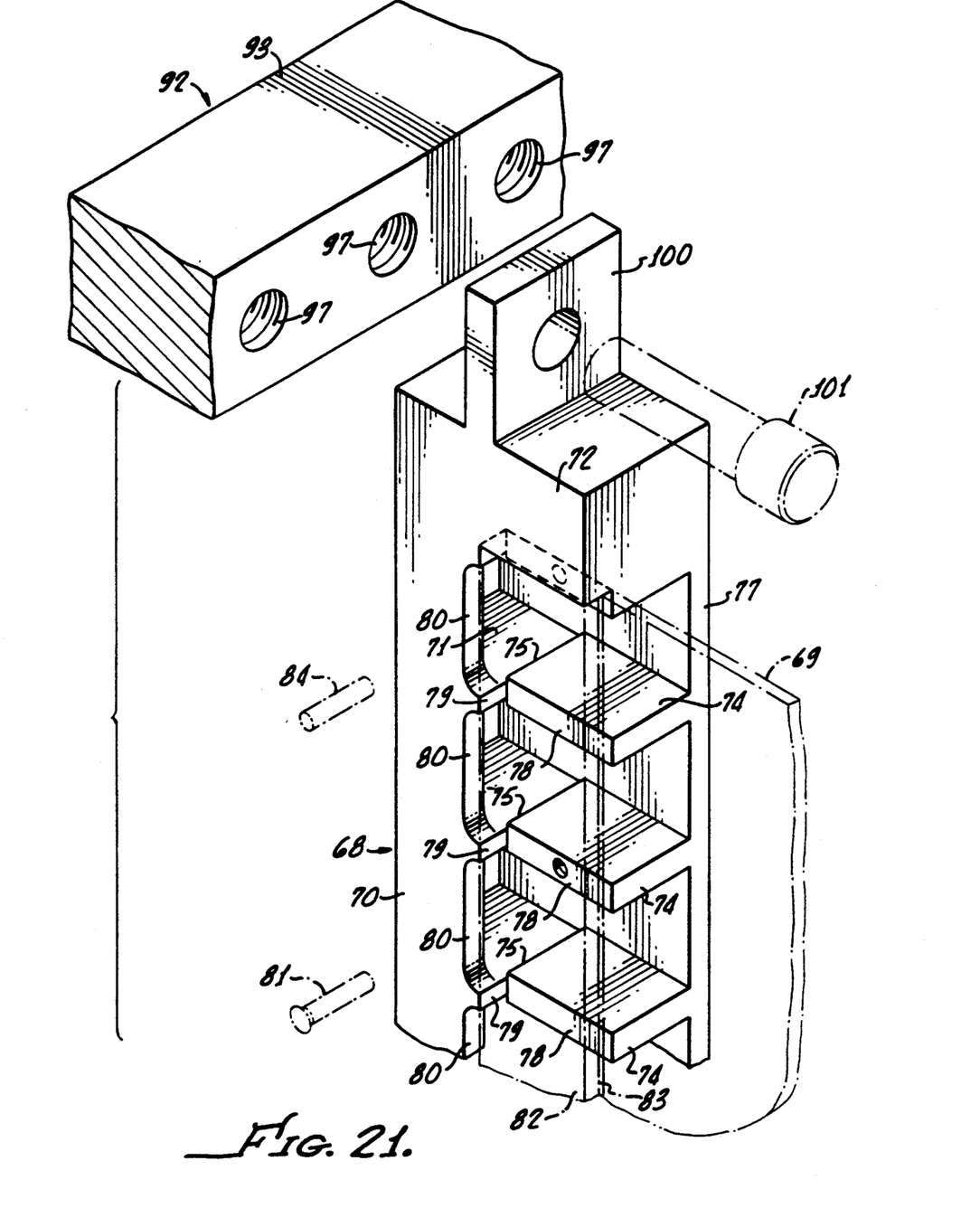
FIG. 21 is an enlarged exploded perspective view illustrating the carrier and its manner of attachment to the midplane frame.
Figure 23:
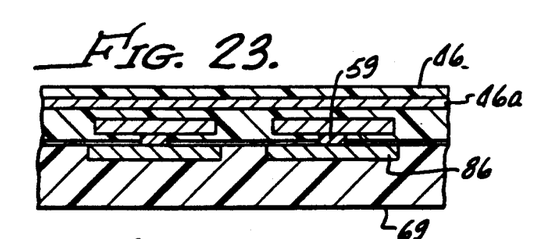
FIG. 23 is an enlarged fragmentary view showing the interconnection of the contacts of the flexible circuit on the connector with the contact pads of a printed circuit board.

The array of contacts 59 is aligned with one of the signal pad contact arrays 86 of the printed circuit board 69. Each of the contact dots 59 of the flexible circuit 46 bears against one of the contacts of the printed circuit board, as seen in FIG. 21. The grounding contact dots 60 of the flexible circuit engage the upper portion of the frame 89a of the ground conductor 89, which is exposed on one side of the printed circuit board 69. The pressure table 35 is biased toward the printed circuit board by the compression springs 44 to accomplish firm engagement and an electrical connection between the contacts of the flexible circuit 46 and those of the printed circuit board 69. The resilient pad 50 distributes the spring force so that an electrical connection is assured at each set of mating contacts.

The clamping bar 82 is tightened into position by the screws 81 only after the connectors 10 are positioned in the pockets in the carrier 68, to permit assembly without damaging the components.

Figure 19:
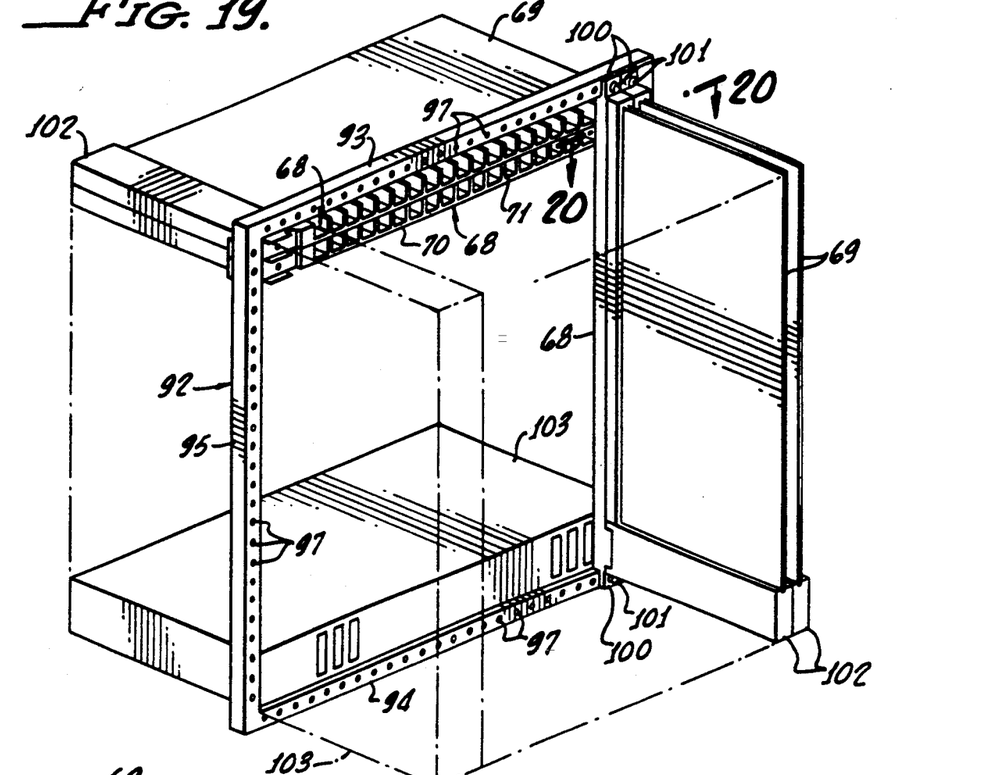
FIG. 19 is a perspective view of an arrangement for interconnecting a number of printed circuit boards by means of a midplane frame.
Figure 20:
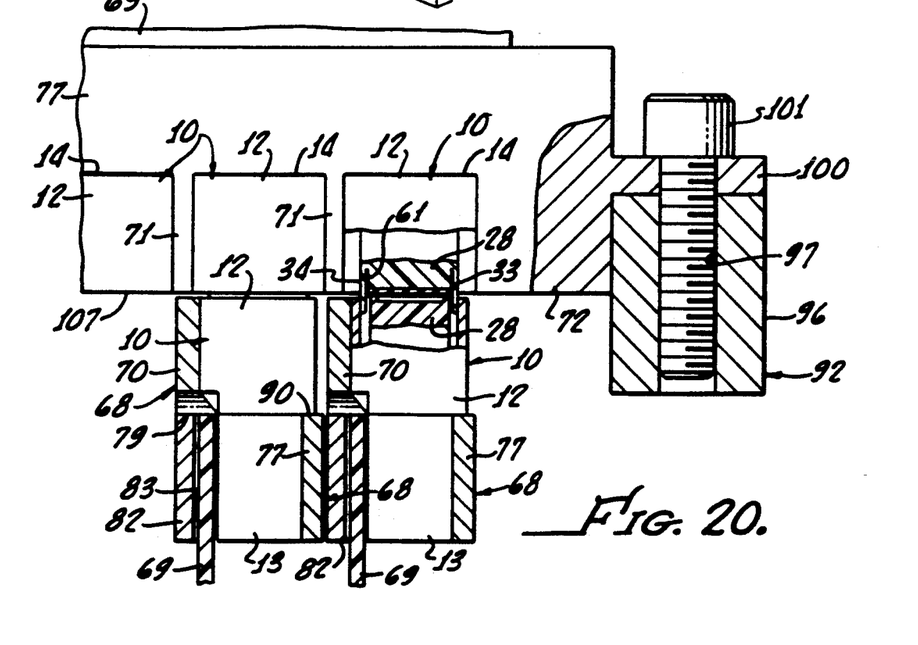
FIG. 20 is an enlarged fragmentary sectional view taken along line 20—20 of FIG. 19.

Connections among various printed circuit boards may be accomplished with the midplane connecting arrangement shown in FIGS. 19 and 20. In this arrangement there is a square frame 92 which, as illustrated, includes parallel top and bottom rails 93 and 94 and side rails 95 and 96. A series of equally spaced threaded openings 97 is provided in the top rail 93 with similar openings formed in the bottom and side rails 94, 95 and 96.

Each of the carriers 68 is provided with an outwardly projecting flange 100 at either end of the carrier. One set of carriers 68, with printed circuit boards 69 attached, is secured to the top and bottom rails 93 and 94 by means of screws 101 that are received in the tapped openings 97. This results in a set of parallel printed circuit boards 69 which are positioned vertically, as the device is illustrated. A second set of printed circuit boards is attached to the side rails 95 and 96 by means of screws 101 that enter the threaded openings 97 of those rails. The result is a set of parallel printed circuit boards 69 which are in a horizontal alignment and are perpendicular to the other set of printed circuit boards.

Within the housing 102 along one edge of each circuit board, as shown in FIG. 19, is the power supply circuitry for the printed circuit board 69, which may be both electrical and optical. This connects to a power supply module 103.

Figure 24:
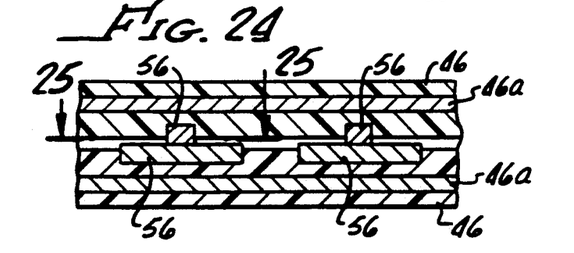
FIG. 24 is an enlarged fragmentary sectional view showing the interengagement of the contacts at the forward ends of two mating connectors.
Figure 25:
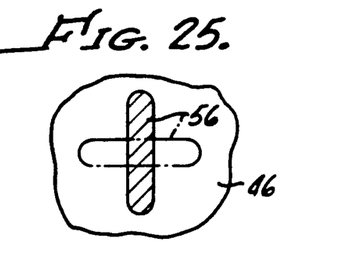
FIG. 25 is a sectional view taken along line 25—25 of FIG. 24.

This brings the forward faces of the connectors 10 of the intersecting printed circuit boards into engagement with each other. The stripe contacts 56 of the two flexible circuits 46 then overlap, one being at right angles to the other. The mating stripe contacts are in a cruciform relationship, as seen in FIGS. 24 and 25, and will make a good electrical connection irrespective of minor misalignments of the printed circuit boards. The floating mounting of the pressure table 28 of each of the connectors, together with the bias provided by the spring 30, assures that all mating contacts will be brought into firm engagement with each other. This also is facilitated by the resilient pads 47 which compensate for any surface irregularities. The arrangement of the frame 92 and associated printed circuit boards 69, with their carriers 68 and connectors 10, enables each printed circuit board in one orientation to be electrically connected to all the other printed circuit boards of the assembly which are at 90 degrees relative thereto.

As the two mating connectors 10 are brought together, their flanges 33 and 34 engage each other at their beveled side edges 104 and 105 to provide an encompassing square border. This also facilitates aligning each set of mating connectors as they are interengaged. The opposite beveled edges 104 and 105 converge slightly toward the outer ends of the flanges 33 and 34 which results in a wedging action at these edges of mating connectors 10.

When grounding clips 61 are provided for the connectors 10 the forwardly projecting flanges 64 and 65 of one grounding clip engage the square base frame of the other. An effective grounding shield is accomplished in this manner.

Figure 22:
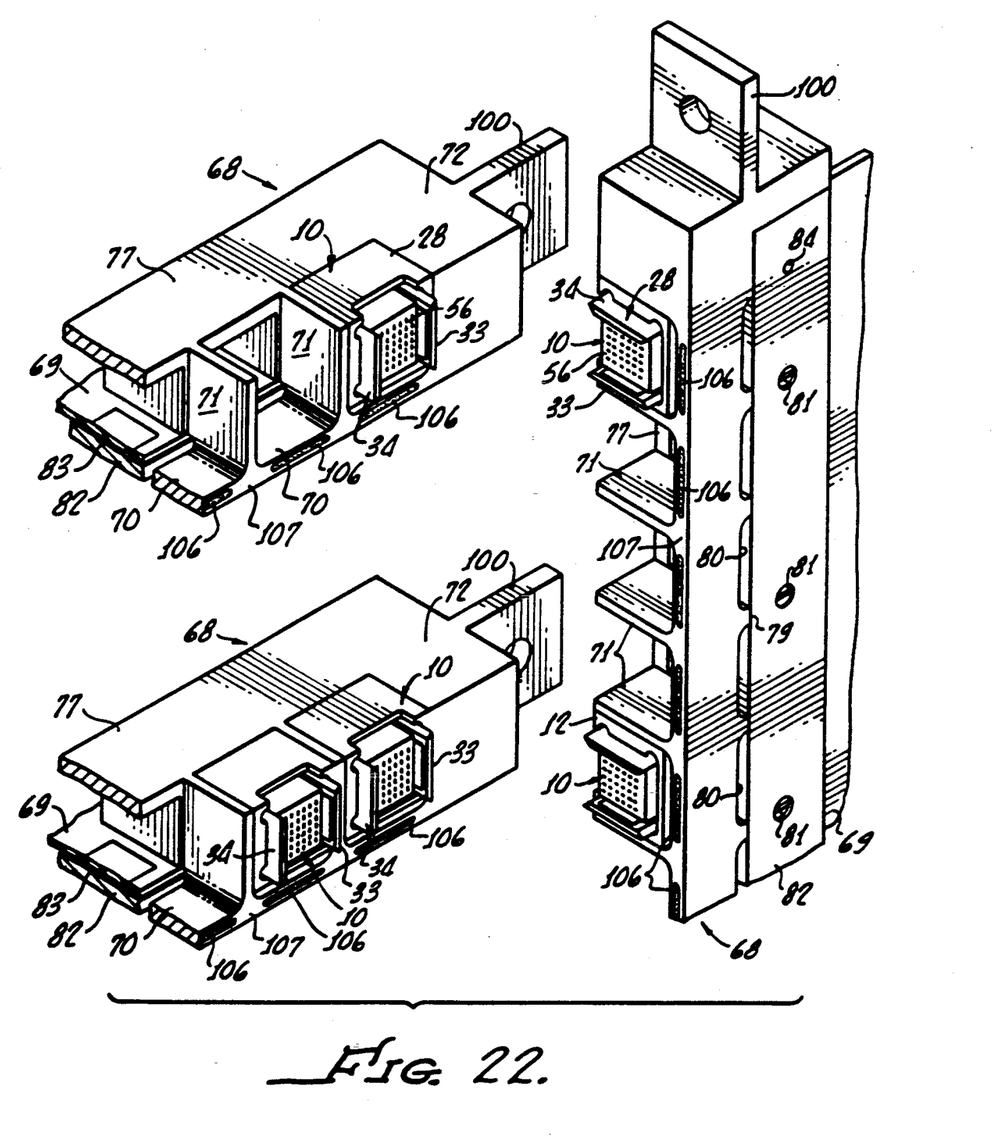
FIG. 22 is a fragmentary perspective view showing the relationship of the connectors and carriers when positioned by the midplane frame.

Additional or alternative grounding may be accomplished by a conductive gasket 106 positioned along the forward longitudinal edge 107 of the base wall 70 of the carrier 68 at each of the pockets for a connector 10. The gaskets 106 engage each other in a cruciform pattern when the two sets of carriers are attached to the frame 92. Only the gaskets of the carriers touch each other; the edges 107 of the carrier 68 do not.

The foregoing detailed description is to be clearly understood as given by way of illustration and example only, the spirit and scope of this invention being limited solely by the appended claims.

What is claimed is:

1. In combination with a printed circuit board having a plurality of spaced contact arrays on a principal surface thereof adjacent one edge thereof, a device for retaining said printed circuit board for connection to a plurality of electrical connectors comprising an elongated member having two parallel longitudinal walls connected by a plurality of parallel transverse walls cooperating with said longitudinal walls to define a plurality of receptacles, said longitudinal walls being displaced transversely, said transverse walls including first portions projecting from one of said longitudinal walls, and second portions projecting from the other of said longitudinal walls, said second portions of said transverse walls being shorter than said first portions of said transverse walls, said one principal surface of said printed circuit board engaging the outer edges of said second portions of said transverse walls with said arrays of said printed circuit board being positioned between said second portions of said transverse walls, and means for connecting said printed circuit board to said elongated member whereby an electrical connector can be inserted into each of said receptacles for making electrical connections with said arrays of said printed circuit board.

2. A device as recited in claim 1 including, in addition, a frame supporting a plurality of said elongated members in a parallel relationship on one side thereof, and a plurality of said elongated members in a parallel relationship on the opposite side thereof, said elongated members on one side of said frame being perpendicular to said elongated members on the opposite side of said frame, whereby electrical connectors carried by said elongated members on one side of said frame can be connected to electrical connectors carried by said elongated members on the opposite side of said frame.

3. A device as recited in claim 1 in which said means for attaching said printed circuit board to said member includes an elongated bar extending over the opposite principal surface of said printed circuit board adjacent said edge thereof, and fastener means extending through said bar and said printed circuit board to engage said member.

4. A device as recited in claim 3 in which said fastener means engage said member at said second portions of said longitudinal walls.

5. A device as recited in claim 1 in which said printed circuit board includes a grounding conductor adjacent said opposite principal surface thereof, said fastener means engaging said grounding conductor for thereby providing a grounding field.

6. A device as recited in claim 5 in which said fastener means includes a fastener, and a grommet surrounding said fastener, said grommet extending through said bar and engaging said grounding conductor of said printed circuit board.

7. In combination with a plurality of electrical connectors each having a forward portion with an array of contacts in a first plane and a rearward portion with an array of contacts in a second plane substantially perpendicular to said first plane, said forward portion having a greater lateral dimension than said rearward portion so as to provide a shoulder therebetween, a device for retaining said electrical connectors for connection to a printed circuit board comprising an elongated member having two parallel longitudinal walls interconnected by a plurality of parallel transverse walls cooperating with said longitudinal walls to define a plurality of receptacles, said longitudinal walls being offset transversely so that said receptacles on one side of said member have openings opposite one of said walls, said electrical connectors being received in said receptacles so that said rearward portions of said connectors are on said one side of said member and said array of contacts thereof face outwardly through said openings, said arrays of contacts of said forward portions facing outwardly on the opposite side of said member, said member including abutment means intermediate said sides thereof engaged by said shoulders for positioning said connectors transversely of said member.

8. A device for retaining a plurality of electrical connectors comprising:

an elongated member having two parallel longitudinal walls interconnected by a plurality of parallel transverse walls cooperating with said longitudinal walls to define a plurality of receptacles, said member having at least two sides defined by said longitudinal walls, said plurality of receptacles being located on said at least two sides, wherein said receptacles have openings opposite one of said longitudinal walls on one of said sides of said elongated member and said receptacles have openings adjacent another of said longitudinal walls on another of said sides of said elongated member, each of said receptacles being adapted to receive an electrical connector which has contact means facing out of said openings, said longitudinal walls being offset transversely, said transverse walls including first portions adjacent to said one of said longitudinal walls and second portions adjacent to said other of said longitudinal walls, each of said longitudinal wall defining a plane and having an edge, said second portions having outer edges spaced from the plane of one longitudinal wall, whereby a printed circuit board can engage said outer edges and the edge of said one longitudinal wall.

9. A device as recited in claim 8 in which said second portions are wider than said first portions to provide a duality of shoulders on each of said walls between said first and second portions thereof which are engageable by a surface of an electrical connector for positioning said electrical connector relative to said member.

* * * * *